US006984288B2

(12) United States Patent
Dhindsa et al.

(10) Patent No.: US 6,984,288 B2
(45) Date of Patent: Jan. 10, 2006

(54) PLASMA PROCESSOR IN PLASMA CONFINEMENT REGION WITHIN A VACUUM CHAMBER

(75) Inventors: Rajinder Dhindsa, San Jose, CA (US); Mukund Srinivasan, Fremont, CA (US); Eric Lenz, Pleasanton, CA (US); Lumin Li, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 227 days.

(21) Appl. No.: 10/032,279

(22) Filed: Dec. 31, 2001

(65) Prior Publication Data

US 2003/0029567 A1 Feb. 13, 2003

Related U.S. Application Data

(60) Provisional application No. 60/311,050, filed on Aug. 8, 2001.

(51) Int. Cl.
*H01L 21/00* (2006.01)
*C23C 16/00* (2006.01)

(52) U.S. Cl. ............................. 156/345.47; 118/723 E; 118/723 R; 156/916

(58) Field of Classification Search ........... 156/345.43, 156/345.44, 345.45, 345.46, 345.47; 118/723 E, 118/723 R; 315/111.21
See application file for complete search history.

(56) References Cited

U.S. PATENT DOCUMENTS

| | | | |
|---|---|---|---|
| 4,464,223 A | | 8/1984 | Gorin |
| 4,579,618 A | | 4/1986 | Celestino et al. |
| 4,612,207 A | * | 9/1986 | Jansen ........................ 427/576 |
| 5,399,254 A | | 3/1995 | Geisler et al. |
| 5,464,499 A | | 11/1995 | Moslehi et al. |
| 5,534,751 A | | 7/1996 | Lenz et al. |
| 5,998,932 A | * | 12/1999 | Lenz ...................... 315/111.21 |
| 6,008,130 A | * | 12/1999 | Henderson et al. ......... 438/710 |
| 6,019,060 A | * | 2/2000 | Lenz ...................... 118/723 R |
| 6,098,568 A | | 8/2000 | Raoux et al. |
| 6,106,663 A | | 8/2000 | Kuthi et al. |
| 6,178,919 B1 | * | 1/2001 | Li et al. .................. 118/723 E |
| 6,270,618 B1 | * | 8/2001 | Nakano et al. ......... 156/345.44 |
| 6,527,911 B1 | * | 3/2003 | Yen et al. .............. 156/345.43 |
| 6,602,381 B1 | * | 8/2003 | Lenz ....................... 156/345.1 |

FOREIGN PATENT DOCUMENTS

EP 0 686 708 12/1995

\* cited by examiner

*Primary Examiner*—Parviz Hassanzadeh
*Assistant Examiner*—Michelle Crowell
(74) *Attorney, Agent, or Firm*—Lowe, Hauptman & Berner, LLP

(57) ABSTRACT

A vacuum plasma chamber for processing a workpiece includes first and second electrodes for electrical coupling with gas in the chamber and respectively connected to first and second relatively high and low frequency RF sources. The chamber includes a wall at a reference potential and a plasma confinement region spaced from the wall. A filter arrangement connected to the sources and the electrodes enables current from the first source to flow to the first electrode, prevents the substantial flow of current from the first source to the second electrode and the second source, and enables current from the second source to flow to the first and second electrodes and prevents the substantial flow of current from the second source to the first source.

28 Claims, 2 Drawing Sheets

PLASMA PROCESSOR IN PLASMA CONFINEMENT REGION WITHIN A VACUUM CHAMBER

RELATION TO CO-PENDING APPLICATION

The present application is a continuation-in-part of our commonly assigned provisional application Ser. No. 60/311, 050, filed Aug. 8, 2001, entitled "Dual Frequency Plasma Etch Reactor with Independent Plasma Density/Chemistry and Ion Energy Control."

FIELD OF INVENTION

The present invention relates generally to vacuum plasma processors and more particularly to a vacuum plasma processor including a plasma excitation region including first, second and third electrodes respectively connected to high and low frequency excitation sources and to a reference potential, wherein the excitation region is confined within a vacuum chamber having a wall at the reference potential. Another aspect of the invention relates to a vacuum plasma processor including a reactive impedance element and an electrode for respectively exciting a plasma in the a vacuum plasma processor with high and low frequency RF, wherein a filter arrangement in supply circuits for the high and low frequencies enables current at the low frequency to flow through the plasma between the electrode and reactive impedance element and substantially prevents current at the high frequency from flowing from the reactive impedance element to the electrode.

BACKGROUND ART

Vacuum plasma processors are used to deposit materials on and etch materials from workpieces that are typically semiconductor, dielectric and metal substrates. A gas is introduced into a vacuum plasma processing chamber where the workpiece is located. The chamber pressure is typically in the range of 0.1 to 1000 torr. The gas is ignited into an RF plasma in response to an RF electric or electromagnetic field. The RF field is provided by a reactive impedance element, usually either an electrode array or a coil which couples both magnetic and electrostatic RF fields to the gas. The reactive impedance element is connected to a first RF source having a first relatively high RF frequency and sufficient power such that the gas is ignited into the plasma. Connections between the first RF source and reactive impedance element are usually by way of a relatively long cable, connected directly to the first RF source. A first resonant matching network connected between the cable and reactive impedance element usually includes a pair of variable reactances adjusted to match the impedance of the first RF source to the load it is driving.

Typically, the gas is introduced into the chamber through the top of the chamber and is withdrawn from the bottom of the chamber. It is common for an electrode at the top of the chamber to be associated with a series of baffles and openings into the excitation region to provide a shower head effect for the gas flowing into the excitation region.

The workpiece is usually mounted on an electrode at the bottom of a plasma excitation region in the chamber. In some chambers, the electrode carrying the workpiece is the reactive impedance element supplied with the first RF frequency and another electrode spaced from the electrode carrying the workpiece is connected to a reference potential, typically ground. As illustrated in FIG. 4 of the previously mentioned co-pending provisional application, it is known to provide such a chamber with exterior walls and a plasma confinement region within the interior of the chamber.

In other chambers, the reactive impedance element is spaced from the electrode carrying the workpiece at the bottom of the excitation region. In some of these other chambers, as illustrated in FIG. 1 of the co-pending previously mentioned provisional application, the reactive impedance element is a coil adjacent to the top of the excitation region and the electrode carrying the workpiece is frequently connected to a second RF source having a second RF frequency considerably lower than the first RF frequency. The second RF source, frequently referred to as a DC bias source because it causes a DC voltage to be established on the electrode, is usually connected to the electrode by a second resonant matching network, also usually including a pair of variable reactances adjusted to match the impedance of the second RF source to the load it is driving. If the reactive impedance element is a coil, the second RF source typically has a frequency in the 2 MHz range. In these other chambers, the coil is located outside the chamber and the electromagnetic field produced in the coil is coupled to gas in an excitation region of the chamber through a dielectric window at the top of the chamber.

The first, relatively high frequency, which is in excess of 10 MHz, controls the density of the plasma, while the second, relatively low frequency, which is less than 10 MHz, controls the energy of ions in the plasma. Independent control of plasma density and ion energy is provided by independently controlling electric parameters, such as power, voltage and/or current, of the first and second RF sources. These other vacuum chambers include a metal wall, usually maintained at a reference potential, for example ground.

In still other chambers, wherein the electrode at the top of the excitation region is connected to a reference potential, the first, relatively high RF frequency is supplied to the metal wall, which functions as the reactive impedance element, while the second, relatively low RF frequency is supplied to the electrode carrying the workpiece. When the vacuum chamber includes a metal wall, the metal wall usually defines the exterior of the plasma excitation region.

In still further configurations, the chamber wall is an insulator and the exterior of the plasma excitation region is defined by plasma confining louvers spaced from the chamber wall and maintained at a reference potential, such as ground. The gas which is excited to a plasma in the excitation region flows through the louvers to an outlet port at the bottom of the chamber. In these further configurations, the electrode at the top of the excitation region is connected to the reference potential.

While the foregoing structures have been adequate for processing prior art workpieces, they are not believed to be adequate to handle deep submicron processing of workpieces, particularly semiconductor wafers meeting increased requirements for etching and deposition of films. Key design parameters for plasma processors meeting these increased requirements are generating and maintaining the correct ratio of ions and radicals to neutral species in the plasma, the residence time of the ions, radicals and neutral species in the excitation region above the workpiece and control of the energy of ions incident on the substrate. These parameters provide wide process control to develop the correct processes for many types of etch and deposition processes. In addition, for workpieces having large areas, the cost of processing each workpiece has become an important parameter in processor design. The mean time between cleaning the chamber interior, the cost of consumables, serviceability of the processor and numerous other factors affect the cost of processing a workpiece in the processor.

SUMMARY OF THE INVENTION

One aspect of the invention relates to a vacuum plasma chamber for processing a workpiece wherein the chamber includes a reactive plasma excitation impedance element connected to a first, relatively high frequency RF plasma excitation source and an electrode for carrying the workpiece is connected to a second, relatively low frequency RF bias source. A filter arrangement connected to the reactive impedance element and the electrode is such that current at the low frequency flows from the electrode to the reactive impedance element without being substantially coupled to the high frequency source and current at the high frequency that flows from the high frequency source is substantially prevented from flowing to the electrode and to the low frequency RF source.

In one preferred embodiment, the filter arrangement includes first and second filters. The first filter is connected to the reactive impedance element and enables current at the high frequency to flow from the high frequency source to the reactive impedance element and substantially prevents current at the low frequency from flowing from the reactive impedance element to the high frequency source. The second filter is connected to the electrode and enables current at the low frequency to flow from the low frequency source to the electrode and substantially prevents current at the high frequency from flowing to the electrode and the low frequency RF source.

The first filter preferably includes a bandpass filter connected in shunt with the reactive impedance element. The shunt filter has a pass band for passing current at the low frequency and substantially attenuating current at the high frequency. The second filter preferably includes a bandpass filter connected in series with the electrode. The series filter has a pass band for passing current at the low frequency and substantially attenuating current at the high frequency.

Another aspect of the invention relates to a vacuum plasma chamber for processing a workpiece wherein the chamber includes first and second electrodes respectively connected to relatively high and low frequency RF sources, a wall at a reference potential, and a plasma excitation region that confines the plasma and is spaced from the wall.

A further aspect of the invention relates to a vacuum plasma chamber for processing a workpiece wherein the chamber includes first and second electrodes respectively connected to relatively high and low frequency RF sources, a wall at a reference potential, and a plasma excitation region for confining the plasma. The plasma excitation region includes the first and second electrodes and louvers that are spaced from the wall and are at the reference potential. The plasma excitation region is arranged to enable gas that is excited to the plasma to flow into the region and out of the region between the louvers.

An additional aspect of the invention relates to a vacuum plasma chamber for processing a workpiece wherein the chamber includes first and second electrodes respectively connected to relatively high and low frequency RF sources, and a third electrode in an excitation region connected to a reference potential (ground). The excitation region i.e. the region including the plasma, is substantially isolated from a chamber wall by a physical plasma confinement arrangement that electrically and/or mechanically confines the plasma to the excitation region while enabling unionized gas to flow from inside to outside the excitation region.

In a preferred embodiment, the electrodes are included in the plasma excitation region that has at least one side, preferably including the louvers at the reference potential, spaced from the chamber wall. The plasma confinement region of the preferred embodiment includes first and second surfaces that are on opposite faces of the excitation region and at the reference potential. The first and second surfaces are respectively located between the louvers and the electrodes.

The excitation region geometry of the preferred embodiment is such that different sheaths are developed between the plasma and the powered electrodes and the first and second surfaces which are at the reference potential. The excitation region geometry of the preferred embodiment is also such that (1) current at the low frequency has a tendency to flow to a greater extent between the electrodes than from the electrode driven by the low frequency to the surfaces at the reference potential and (2) current at the high frequency has a tendency to flow to a greater extent between the electrode driven by the high frequency to the surfaces of the excitation region at the reference potential than between the electrodes.

The above and still further objects, features and advantages of the present invention will become apparent upon consideration of the following detailed description of one specific embodiment thereof, especially when taken in conjunction with the accompanying drawings.

BRIEF DESCRIPTION OF THE DRAWING

FIG. 3 is an electric schematic diagram of the plasma processor illustrated in FIG. 1.

DETAILED DESCRIPTION OF THE DRAWING

Figure 1:
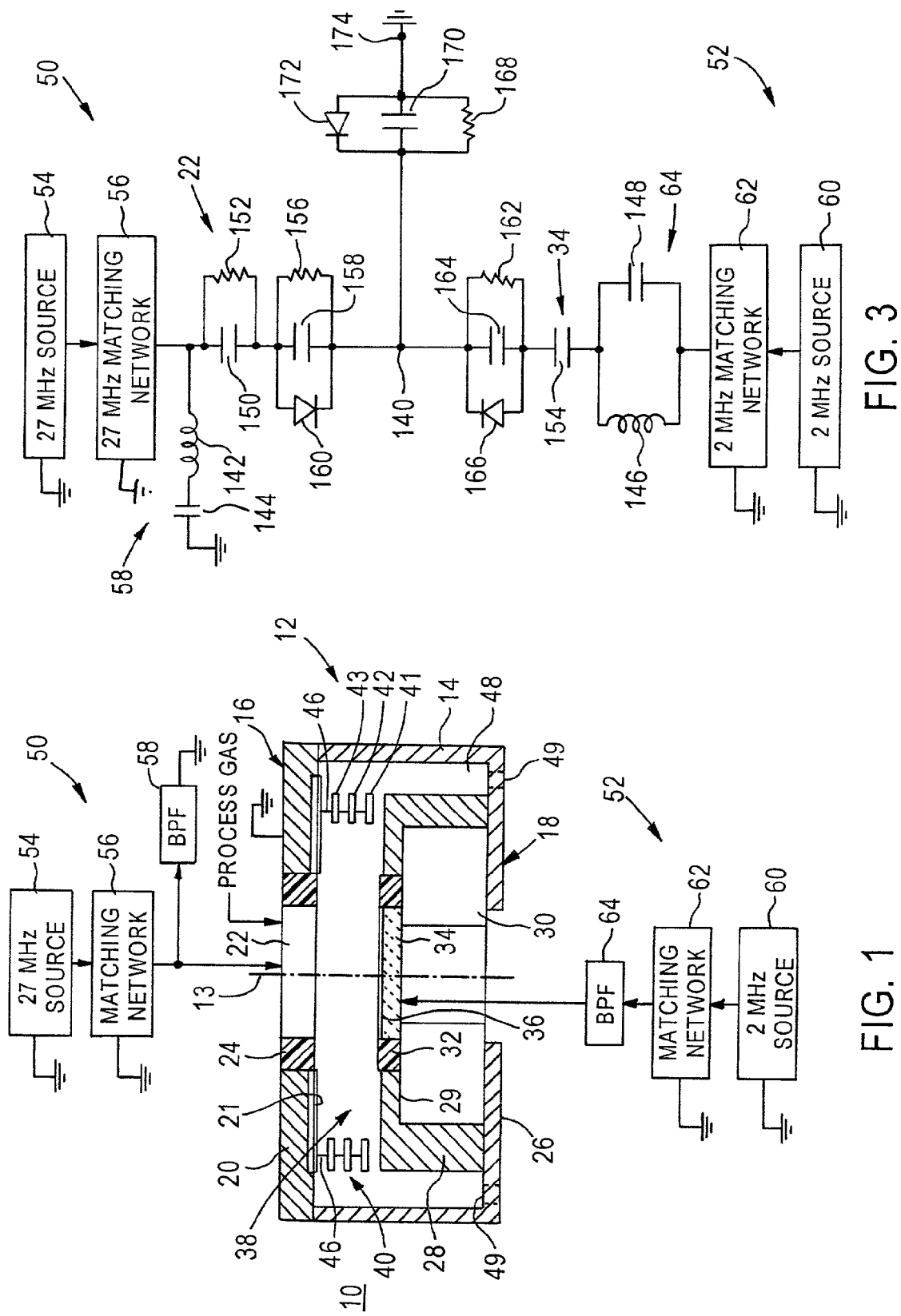
FIG. 1 is a schematic diagram of a plasma processor in accordance with a preferred embodiment of the invention.

Reference is now made to FIG. 1 of the drawing wherein plasma processor 10 is illustrated as including vacuum chamber 12, preferably having a cylindrical configuration so that the chamber is symmetrical with respect to its central longitudinal axis 13. Chamber 12 includes high electrical conductivity cylindrical metal sidewall 14 maintained at RF and DC reference potential (e.g., ground), as well as circular ceiling 16 and circular base 18. Ceiling 16 includes annular exterior high electrical conductivity metal plate 20 which carries on its lower face high electrical conductivity ring 21. Plate 20 and ring 21 are electrically and mechanically connected to wall 14 so that plate 20 and ring 21 are also at RF and DC ground potential. Ceiling 16 also includes circular, metal electrode 22 (a plasma exciting reactive impedance element) and annular electric insulator 24 that separates and electrically insulates electrode 22 from plate 20. Plate 20, ring 21, electrode 22 and insulator 24 are coaxial with axis 13.

Base 18 includes annular exterior metal plate 26, electrically and mechanically connected to wall 14 so that plate 26 is also at RF and DC ground potential. Plate 26 carries high electrical conductivity metal tube 28 having an exterior diameter that is approximately 80 percent of the interior diameter of wall 14. Tube 28 projects into chamber 12 and is mechanically and electrically connected to plate 26 so that the cylinder is also at RF and DC ground potential. Tube 28 carries high electrical conductivity ring 29 that extends radially inwardly of chamber 12 so that the ring is parallel to base plate 26 and is at RF and DC ground potential. Plate 26 also carries tubular electric insulator 30 having an exterior sidewall contacting the interior sidewall of tube 28 and an upper face bearing the lower face of ring 29. The upper face of insulator 30 also carries electric insulator ring 32 and circular electrode 34 for carrying workpiece 36, which is preferably a semiconductor wafer, but can be a dielectric or metal substrate. Ring 32 electrically insulates electrode 34 from ring 29, by virtue of the ring having exterior and interior edges respectively abutting the interior edge of ring 29 and the exterior edge of electrode 34. Electrode 34 is frequently arranged as an electrostatic chuck connected to a DC chucking voltage source (not shown), in which case electrode 34 includes an arrangement (not shown) for cooling workpiece 36 while the workpiece is being processed by plasma in chamber 12. Plate 26, tube 28, ring 29, insulator 30, ring 32 and electrode 34 are coaxial with axis 13; when workpiece 36 is properly in place on electrode 34 the workpiece is also coaxial with axis 13.

Process gas from a suitable source (not shown) is introduced into plasma excitation region 38 through electrode 22, which includes a series of baffles and openings so that the process gas flows into region 38 with a showerhead effect. In plasma excitation region 38, the process gas is converted into the plasma which processes workpiece 36 in response to electric fields electrodes 22 and 34 respectively couple to the excitation region at relatively high and low frequencies; in the preferred embodiment the high and low frequencies are respectively 27 MHz and 2 MHz. The amount of power at the high frequency supplied to electrode 22 controls the density of the plasma in excitation region 38, while the amount of power at the low frequency supplied to electrode 34 controls the ion energy in the plasma. While the low and high frequencies are preferably 2 MHz and 27 MHz, is to be understood that other suitable low and high frequencies which respectively control the ion energy in the plasma and the plasma density can be employed. Controlling the high and low frequency power supplied to electrode 22 and 34 causes uniform production of etch species in the plasma above workpiece 36, which results in uniform etching of the entire workpiece.

Plasma excitation region 38, which is coaxial with axis 13, is spaced from sidewall 14 by virtue of the region including louver arrangement 40. In one embodiment, the louvers of arrangement 40 are grounded for DC and RF, and include three vertically stacked, electrically grounded rings 41–43, having a high electrical conductivity. Grounded rings 41–43, as well as rings 21 and 29, are preferably made of silicon carbide doped to have a high electrical conductivity on the order of $2 \times 10^{-3}$ ohm-centimeters and able to withstand the harsh environment of the plasma in region 38. Grounded rings 41–43 can be made of other materials having high electrical conductivity, e.g. aluminum or graphite. Grounded rings 41–43 are electrically and mechanically connected by metal posts 46 to grounded metal plate 20. Grounded rings 41–43, which are coaxial with axis 13 and fixedly positioned relative to each other, have aligned inner edges which are also aligned with the inner diameter of the vertically extending wall of tube 28 that abuts the outer wall of insulator 30. Rings 41–43 have aligned outer edges which are also aligned with the outer diameter of the outer vertically extending wall of tube 28.

The electrical grounding of rings 41–43 assists in confining the plasma to region 38 within the louvers. The mechanical relation of rings 41–43 also assists in confining the plasma while enabling gas that is no longer ionized or which was not ionized in region 38 to flow in a generally horizontal direction through the openings between the rings. The gas flows through the space between rings 41–43 into annular passage 48 that is coaxial with axis 13 and includes inner and outer walls respectively defined by exterior wall of tube 28 and the interior of wall 14. Thus, region 38 can be considered as a plasma confinement region which is spaced from chamber wall 14 that has virtually no plasma from region 38 incident on it. The bottom of passage 48 is connected by opening 49 in plate 26 to a conduit (not shown), in turn connected to a pump (not shown) which sucks the gas from the interior of chamber 12 and maintains the chamber interior outside of region 38 at a vacuum, typically having a value less than 50 millitorr, and preferably about 5 to 10 millitorr. The pressure in region 38 is typically considerably higher, e.g. 20 to 500 millitorr, a result achieved because of the relatively high flow impedance that louver arrangement 40 provides. In one embodiment, the spacing between adjacent pairs of grounded louvers 41–43 is 6.35 mm (0.25 inch).

It is not necessary in all instances for louvers 41–43 to be highly conductive and grounded, i.e., to provide electrical plasma confinement. Adequate confinement of the plasma to region 38 is provided with a mechanical arrangement including plural (preferably three) dielectric (i.e., low electrical conductivity), electrically floating louver rings made, e.g., from quartz or low conductivity SiC. To provide the plasma confinement effect, such louver rings must be spaced from each other by an amount that provides a sufficiently high flow impedance for the gas flowing from region 38 to the chamber region between louver arrangement 40 and chamber wall 14. To assist in providing the required plasma confinement for different pressure conditions between region 38 and the remainder of the chamber, i.e., from inside region 38 to outside region 38, the spacing between adjacent pairs of the three dielectric louver rings is variable. We have found that for pressures in region 38 between 200 and 500 millitorr and pressures outside of region 38 between 5 and 10 millitorr, the spacing between adjacent pairs of the three floating louver rings should be between about 0.762 and 3.175 mm. (0.030 and 0.125 inch). Such spacings with the stated pressures provide adequate plasma confinement to region 38 and substantially prevent the plasma from being incident on wall 14. The variable spacing between the louvers, which can be achieved with conventional mechanical mechanisms, helps to determine the gas pressure in region 38 so that adjusting the spacing controls the confinement region pressure and degree of plasma confinement.

Plasma excitation region 38 is bounded by electrodes 22 and 34, conducting rings 21 and 29 and insulator rings 24 and 32, as well as louver rings 41–43. The plasma in excitation region 38 is bounded by a sheath of neutral particles that forms a capacitance between the plasma, which generally can be considered as a resistive load on electrodes 22 and 34, and the surfaces defining the boundary of region 38. A DC bias voltage across the sheath is controlled primarily by the amount of power at the low frequency supplied to electrode 34.

In the preferred embodiment, the grounded electrodes bounding the surface of excitation region 38 have an area that is considerably greater than the area of the powered electrodes bounding the surface of the excitation region. Preferably the area ratio of the powered electrodes to the grounded electrodes is about 1.2:2.5. In other words, the sum of the areas of grounded rings 20 and 29 bounding the surface of excitation region 38 is about twice as large as the individual area of each of powered electrodes 22 and 34 bounding the surface of excitation region 38. We have found that this area ratio assists in decoupling the high frequency RF power applied to electrode 22 from electrode 34. In addition, the stated area ratio helps in developing high DC bias across electrode 34; the DC bias on each electrode is a function of the ratio of sheath capacitance across that electrode and the return electrode. For 2 MHz power, the return electrode comprises powered electrode 22 as well as grounded rings 20 and 29; for 27 MHz power from electrode 22, the return electrode mainly includes grounded rings 20 and 29 since bandpass filter 64 (described infra) substantially prevents coupling of 27 MHz power to electrode 34. DC bias on the electrode 34 is a function of sheath capacitance across electrode 34 and the sum of sheath capacitances across electrode 22 and across the ground rings 20 and 29.

The DC bias and, therefore, the sheath capacitance associated with electrode 34, could be actively controlled by including a DC voltage probe (not shown) for monitoring the DC voltage between electrode 34 and the plasma. Such a DC voltage probe derives a signal for controlling the 2 MHz power supplied to electrode 34 so that a relatively high bias voltage is maintained on all surfaces inside the plasma excitation region. By optimizing suitable area ratio among the electrodes 22, 34 and the ground ring 20 and 29, a relatively high bias voltage on the plasma excitation region surfaces can be maintained which helps to remove polymer that tends to deposit on the chamber surfaces during workpiece processing. By removing the polymer, processor 10 runs in a clean mode to greatly increase the mean time between cleaning and thereby provide greater workpiece processing throughput.

The volume of plasma excitation region 38 is relatively small which provides advantages relating to serviceability, cost of consumable surfaces and overall low cost of processor 10. In one preferred embodiment, the radii of electrodes 22 and 34 are respectively 10.5 cm and 9.6 cm and the radius of region 40 between centerline 13 and the inner edge of rings 41–43 is 13.45 cm, while the outer radius of each of insulator rings 22 and 34 is 11.4 cm. The spacing between the bottom face of electrode 22 and the top face of electrode 34 has a nominal value of 1.8 cm. The spacing between these faces of electrodes 22 and 34 is variable, in a manner described infra., over a limited range to provide additional control over coupling of the 2 MHz excitation from electrode 34 to electrode 22. The aforementioned dimensions have also been found to assist in causing a high DC bias voltage to be developed on electrode 34 and to assist in establishing decoupling from electrode 34 of the 27 MHz RF power supplied to electrode 22.

Circuits 50 and 52 respectively provide the 27 MHz and 2 MHz excitation for electrodes 22 and 34. Circuit 50 includes 27 MHz source 54 having sufficient power to energize electrode 22 to excite the gas in region 38 into a plasma state and to provide the desired density for the plasma. Circuit 52 includes 2 MHz source 60 having sufficient power to energize electrode 34 to establish a substantial DC bias voltage on electrode 34 and the desired ion energy in the plasma in excitation region 38.

RF source 54 drives matching network 56 including variable reactances (not shown) which are controlled in a known manner to maintain an impedance match between the output impedance of source 54 and the load it drives, including electrode 22 and the plasma in region 38. Bandpass filter 58 is connected between the output terminal of matching network 56 and electrode 22. Filter 58 has a pass band arranged to pass the 27 MHz output of source 54 to electrode 22, while providing a low impedance path to ground for the 2 MHz current that source 60 supplies to electrode 34 and which flows through the plasma in region 38 to electrode 22.

Filter 58 can be configured as a branch connected in shunt between the output terminal of matching network 56 and ground, wherein the branch includes a series resonant circuit tuned to the 2 MHz frequency of source 60. The branch of filter 58 can include a simple tuned circuit in the form of an inductor in series with a capacitor. The 27 MHz output of source 54, as coupled to the output terminal of matching network 56, is not affected by filter 58 and is coupled to electrode 22, but the 2 MHz current that source 60 supplies to electrode 34 flows through filter 58 to ground. Thereby, 27 MHz source 54 is protected by filter 58 from the 2 MHz excitation of electrode 34 and current at the 2 MHz frequency advantageously flows in the plasma across the gap between the opposed faces of electrodes 22 and 34.

2 MHz source 60 of circuit 52 drives matching network 62 including variable reactances (not shown) which are controlled in a known manner to maintain an impedance match between the output impedance of source 60 and the load it drives, including electrode 34 and the plasma in region 38. Bandpass filter 64 is connected between the output terminal of matching network 62 and electrode 34. Filter 64 has a pass band arranged to pass the 2 MHz output of source 60 to electrode 34 while providing a high impedance path for the 27 MHz current that source 54 supplies to electrode 22.

Filter 64 can be configured as a branch connected in series between the output terminal of matching network 62 and electrode 34, wherein the branch includes a parallel resonant circuit tuned to the 27 MHz frequency of source 54. The branch of filter 64 can include a simple tuned circuit in the form of an inductor in parallel with a capacitor. The 2 MHz output of source 60, as coupled to the output terminal of matching network 62, is not affected by filter 64 and is coupled to electrode 34, but filter 64 blocks the 27 MHz current that source 54 supplies to electrode 22. Thereby, 2 MHz source 60 is protected by filter 64 from the 27 MHz excitation of electrode 22 and substantial current at the 27 MHz frequency is advantageously prevented from flowing in the plasma completely across the gap between the opposed faces of electrodes 22 and 34.

Because of filter 64, inter alia, current at the 27 MHz frequency is limited to the portion of the plasma in region 38 which is adjacent electrode 22. The 27 MHz excitation generally does not penetrate across the gap to the plasma adjacent electrode 34 and workpiece 36. By limiting the high frequency, 27 MHz current to the portion of the plasma in region 38 adjacent electrode 22, better control of plasma density is attained. While specific bandpass filters 58 and 64 have been described, it is to be understood that other filter configurations can provide the same or substantially the same results.

Figure 2:
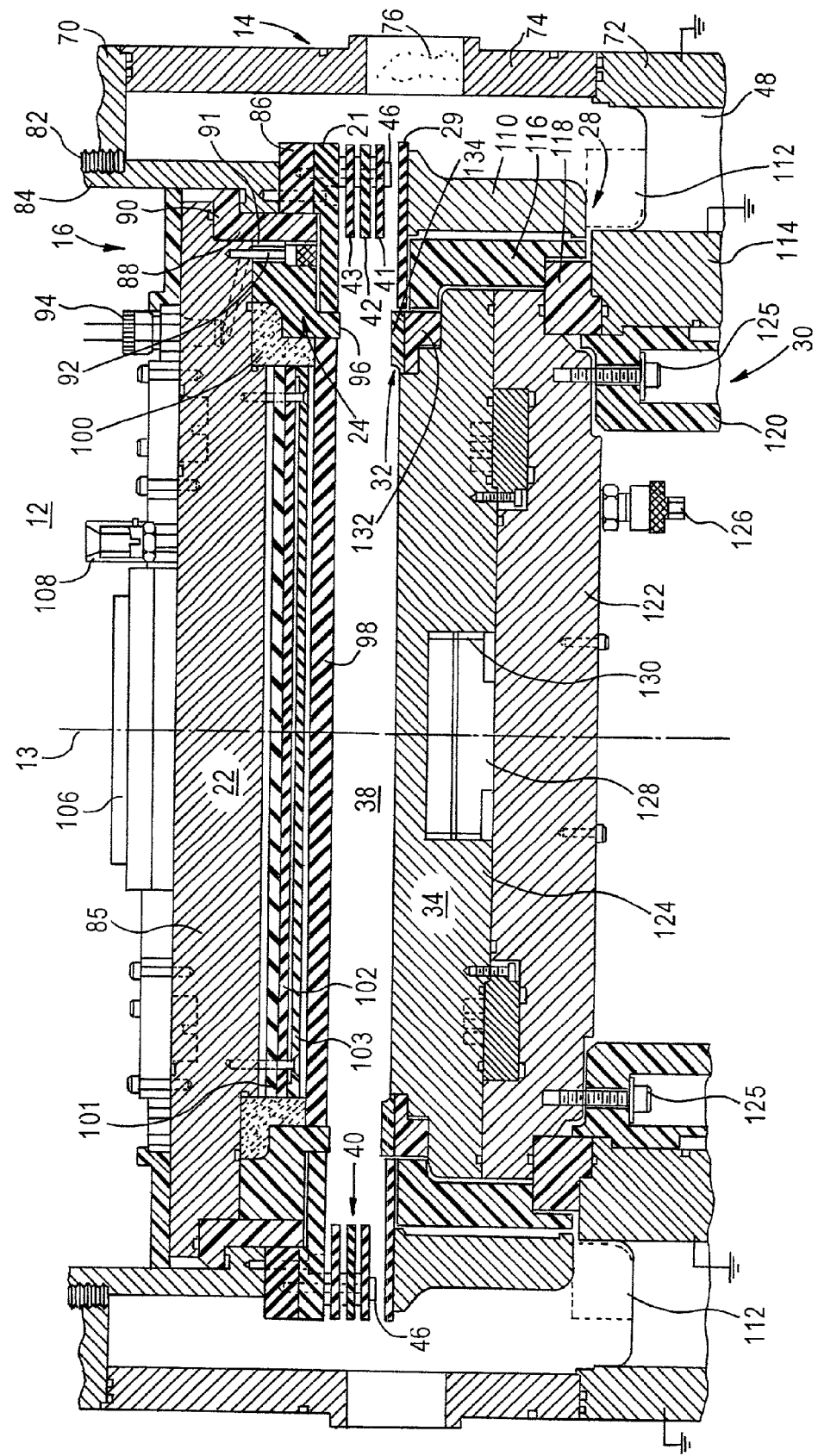
FIG. 2 is a cross-sectional view of a preferred embodiment of the vacuum plasma processor chamber illustrated in the processor of FIG. 1.

Reference is now made to FIG. 2 of the drawing, a detailed cross-sectional view of a preferred embodiment of chamber 12. Cylindrical wall 14 includes metal, grounded cylinders 70 and 72 which are respectively above and below plasma excitation region 38 and are electrically and mechanically connected to each other by metal ring 74 including glass viewing port 76 that is generally aligned with region 38. Cylinder 70 has an interior wall that is bonded to an outer wall of the metal bellows 82, having an annular shape so the bellows is coaxial with axis 13. The interior wall of bellows 82 is bonded to metal sleeve 84 that is coaxial with axis 13. Bellows 82 has a top face connected to a vertically translatable actuator (not shown) for driving the bellows up and down to provide vertical movement of sleeve 84 relative to fixed side wall 14 including cylinders 70 and 72, as well as ring 76. The relative movement between sleeve 84 and side wall 14 causes the gap in excitation region 38 between electrodes 22 and 34 to be changed at will.

Sleeve 84 has a lower edge fixedly connected to an upper face of metal, preferably aluminum, ring 86, having a lower face fixedly connected to a portion of the upper face of silicon carbide, high electrical conductivity ring 21. Metal post 46, which carries silicon carbide rings 41–43 and is preferably configured as a screw, is driven into a threaded bore that is common to rings 21 and 86 to fixedly connect rings 41–43 in place at the periphery of region 38. Electrical insulating ring 88, preferably made of aluminum trioxide ($Al_2O_3$), is interposed between electrically grounded sleeve 84 and metal plate 85 of powered electrode 22 so that sleeve 84 and electrode 22 are electrically insulated from each other. Ring 88 includes shoulder 90 having opposed surfaces to which plate 85 and sleeve 84 are fixedly connected. Ring 88 has an interior wall abutting the exterior wall of high dielectric ring 91, having an interior surface which provides an exterior wall for a chamber for pressure probe 92. The interior wall of the chamber for pressure probe 92 is provided by the exterior wall of insulating ring 34, preferably made of aluminum trioxide. Passage 94 in plate 85 connects pressure probe 92 in fluid flow relation to fitting 94 at the top of plate 85.

Ring 24 includes a downwardly depending appendage 96 having a bottom face that extends into excitation chamber 38, slightly below the aligned bottom faces of silicon carbide ring 21 and circular silicon plate 98 which forms the part of the electrode 22 on the upper boundary of excitation chamber 38. Such an arrangement assists in providing electrical isolation between ring 21 and plate 98. Appendage 96 has inner and outer walls respectively abutting the outer edge of plate 98 and the inner edge of ring 21. Ring 24 has interior horizontally and vertically extending surfaces abutting corresponding surfaces of graphite ring 100, having a lower edge bonded to silicon plate 98.

Electrode 22, in addition to including aluminum plate 85 at the top of the electrode and silicon plate 98 at the bottom of the electrode, includes spaced baffle plates 101–103, interposed between plates 85 and 98 to provide a fluid flow path for gas to be excited to the plasma in region 38. The gas is introduced through fitting 106 on the top face of aluminum plate 85, which includes a passage (not shown) for supplying the gas to the baffle plates. Plate 98 includes openings (not shown) for the gas flowing through baffle plates 101–103, to provide a showerhead effect for the gas flowing into excitation region 38. The top face of aluminum plate 85 is mechanically and electrically connected to electrical connector 108, in turn connected to a lead connected to be responsive to the 27 MHz current that source 54 produces and which flows through matching network 56. The top face of plate 85 also includes passage 109 connected to a source of coolant fluid (not shown) for controlling the temperature of electrode 22.

Grounded metal tube 28 of the bottom assembly includes aluminum ring 110 having an upper face electrically and mechanically connected to the lower face of silicon carbide ring 29 and a lower face electrically and mechanically connected by a plurality of metal blocks 112 to the exterior side wall of aluminum tube 114. Blocks 112 are equispaced about the exterior side wall of tube 114 in passage 48 so the blocks do not have a substantial effect on the flow of gas in passage 48 from excitation region 38 to openings in metal base plate 18. Plate 18 is mechanically and electrically connected to the lower edges of tubes 72 and 114. Thereby, ring 110 and tube 114, which together form tube 28 of FIG. 1, are at the same RF and DC ground potential as tube 72 and wall 14.

Electrical insulating assembly 115 including quartz ring 116 and aluminum trioxide ring 118 electrically insulates metal ring 110 and metal tube 114 from electrode 34. Insulating ring 116 has a top face adjacent to but slightly spaced from the bottom face of silicon carbide ring 29 and an outer wall adjacent to but slightly spaced from the inner wall of ring 110. The lower part of ring 116 has a shoulder which bears against the top face of ring 118. Ring 116 also includes a downwardly depending flange interposed between the exterior wall of ring 118 and the lower portion of the interior wall of ring 110. Ring 118 has a bottom face which bears against the top edge of metal tube 114, having an inner wall abutting the outer wall of electrically insulating, aluminum trioxide sleeve 120 which is fixedly attached to the bottom of circular aluminum plate 122 by a plurality of screws 125 (only one of which is shown).

Quartz ring 116 has an interior wall adjacent to but slightly spaced from the peripheries of stacked circular aluminum plates 122 and 124 which form electrode 34 and are electrically mechanically connected to each other. Electrical connector 126 is mechanically and electrically connected to the bottom face of plate 122 and is connected to a lead which supplies the 2 MHz output of source 60 to the connector. Cavity 128 in the lower face of plate 124 includes lifter pins 130 for lifting workpiece 36 from the top face of plate 124. The upper face of plate 124 also includes a cavity (not shown) into which a coolant, such as helium, flows to assist in controlling the temperature of workpiece 36 during processing. Plate 122 includes grooves (not shown) through which a coolant liquid flows to assist in controlling the workpiece temperature.

Insulating ring 32, which electrically isolates metal plate 124 of powered electrode 34 from grounded silicon carbide ring 29, includes quartz ring 132 having a top face to which relatively thin quartz ring 134 is bonded. Quartz ring 132 fits in an annular volume between outer vertical and horizontal surfaces of plate 124 and an upper side wall portion of quartz ring 116. Ring 132 is bonded to the outer vertical and horizontal surfaces of plate 124 and is spaced slightly from the upper side wall portion of quartz ring 116. The upper face of ring 134 extends into chamber 38, slightly above the aligned top faces of silicon carbide ring 29 and plate 124 of electrode 34 to assist in providing electrical isolation between ring 29 and electrode 34.

It is to be understood that the processor chamber illustrated in FIG. 2 includes the usual gaskets and other elements necessary to seal the chamber interior to attain the necessary vacuum for workpiece processing. The spacings between the various parts are provided because of the different coefficients of thermal expansion of these parts and the elevated temperatures which occur in the chamber during workpiece processing compared to the temperature of the chamber during non-operating intervals.

Reference is now made to FIG. 3 of the drawing, an electric schematic, equivalent circuit diagram of the processor illustrated in FIG. 1 and the chamber illustrated in FIG. 2. The processor of FIG. 1 can be considered as a dual frequency triode because excitation region 38 includes a ground electrode and two electrodes powered by different RF frequencies.

Because the excited plasma in region 38 can be considered as a relatively low resistance, the plasma is illustrated in FIG. 3 as terminal 140. Circuit 50 includes high frequency RF source 54, matching network 56 and shunt bandpass filter 58 comprising inductor 142 and capacitor 144 which are connected in series with each other between the output terminal of matching network 56 and ground. Inductor 142 and capacitor 144 have values such that they provide a series resonant circuit for the 2 MHz current that source 60 derives. Circuit 52 includes relatively low frequency RF source 60, matching network 62 and series bandpass filter 64 comprising inductor 146 and capacitor 148 which are connected in parallel with each other between the output terminal of matching network 56 and electrode 34. Inductor 146 and capacitor 148 have values such that they provide a parallel resonant circuit for the 27 MHz current that source 54 derives.

Upper electrode 22 can be considered as capacitor 150 in parallel with resistor 152, while lower electrode 34 can be considered as capacitor 154. The plasma sheath between electrode 22 and plasma 140 is represented by the parallel combination of resistor 156, capacitor 158 and diode 160, poled to pass positive current from source 54 to plasma 140 so that the plasma is at a DC voltage which is lower than the DC voltage of electrode 22. The plasma sheath between electrode 34 and plasma 140 is represented by the parallel combination of resistor 162, capacitor 164 and diode 166, poled to pass positive current from source 60 to plasma 140 so that the plasma is at a DC voltage which is lower than the DC voltage of electrode 34. The plasma sheath between plasma 140 and the grounded surfaces including, inter alia, rings 21, 29, 41–43 and 110, is represented by the parallel combination of resistor 168, capacitor 170 and a diode 172, poled to pass negative current from plasma 140 to the grounded surfaces (represented by terminal 174) so that the plasma is at a DC voltage which is higher than the DC voltage of the grounded surfaces.

From FIG. 3, the high frequency current from source 54 flows through upper electrode 22, the upper sheath represented by resistor 156, capacitor 158 and diode 160 to plasma 140. Because of the high impedance effects of bandpass filter 64 to the high frequency current, the high frequency current is substantially prevented from flowing in circuit 52 and flows to ground terminal 174 from plasma 140 by way of the sheath including resistor 168, capacitor 170 and diode 172. The geometry of chamber 12, as previously described, enhances this flow of current from source 54 to plasma 140, thence to ground terminal 174. Hence, precise control over the density of the plasma in excitation region 38 can be provided by precise control of the power of RF source 54.

The low frequency current from source 60 flows through lower electrode 34, thence primarily to upper electrode 22 by way of the lower sheath including resistor 162, capacitor 164 and diode 166, plasma 140 and the upper sheath including resistor 156, capacitor 158 and diode 160. Because of the low impedance effects of bandpass filter 58 to the low frequency current, the low frequency current readily flows from plasma 140 through filter 58 to ground. The geometry of chamber 12, as previously described, assists in preventing a substantial flow of low frequency current from source 60 to ground terminal 174 by way of the ground sheath including resistor 168, capacitor 170 and diode 172. Hence, precise control over the energy of the ions in the plasma in region 38 can be provided by precise control of the power of RF source 60.

By providing precise control over the density of the plasma and the energy of the ions in region 38, the correct ratio of ions and radicals to neutral species in the plasma is provided and maintained. Consequently, accurate control of the residence time of the ions, radicals and neutral species in the volume above workpiece 36, as well as the energy of the ions bombarding the workpiece, is provided. Because of these factors, processor 10 provides better control than prior art processors for a wide variety of etch processes, such as HARC, SAC and Low-K.

The geometry of chamber 12, including the confinement of the plasma to the relatively small volume of the region 38, is such that a substantial bias voltage is developed on all surfaces in region 38, as seen from FIG. 3. The substantial bias voltage is established by virtue of the sheaths between plasma 140 and (1) electrode 22, (2) electrode 34 and (3) the grounded surfaces of region 38 represented by terminal 174. The bias voltages and the sheaths tend to prevent the plasma from being incident on the surfaces in excitation region 38, to (1) keep the surfaces clean during processing and, therefore, substantially increase the mean time between cleaning of the chamber interior, and (2) reduce consumption of these surfaces by the plasma to prolong the life of the surfaces.

While there has been described and illustrated a specific embodiment of the invention, it will be clear that variations in the details of the embodiment specifically illustrated and described may be made without departing from the true spirit and scope of the invention as defined in the appended claims. For example, the pressure in region 38 can be controlled with a closed loop controller including a pressure sensor in the region and a drive responsive to a pressure set point and the pressure sensor for controlling the spacing between louvers 41–43.

We claim:

1. A vacuum plasma chamber for processing a workpiece, the chamber including: a first electrode for electrical coupling with gas in the chamber and for connection to a first relatively high frequency RF source, a second electrode for carrying the workpiece and electrical coupling with gas in the chamber and for connection to a second relatively low frequency RF source, an exterior wall at a reference potential, and a plasma excitation region for confining the plasma, the region being spaced from the exterior wall, wherein
the plasma excitation region including (a) louvers spaced from the wall, the plasma excitation region being arranged so that the gas flows into the plasma excitation region through the first electrode and out of the plasma excitation region between the louvers, and (b) first and second surfaces at the reference potential, the first surface being located between the louvers and the electrode for carrying the workpiece, the second surface being located between the louvers and the first electrode.

2. The chamber of claim 1 wherein the plasma excitation region is bounded by said electrodes and louvers.

3. The chamber of claim 1 wherein the plasma excitation region is symmetrical with respect to the chamber exterior wall and a center point on the electrode for carrying the workpiece.

4. The chamber of claim 1 wherein the excitation region has a geometry such that different sheaths are developed between the plasma in the excitation region and between each of (a) the electrode for carrying the workpiece, (b) the first electrode and (c) the first and second surfaces at the reference potential.

5. The chamber of claim 4 wherein the excitation region geometry is such that current at the low frequency has a tendency to flow to a greater extent between the electrode for carrying the workpiece and the first electrode than from the electrode for carrying the workpiece to the surfaces of the excitation region at the reference potential.

6. The chamber of claim 5 wherein the excitation region geometry is such that current at the high frequency has a tendency to flow to a greater extent between the first electrode to the surfaces of the excitation region at the reference potential than from the first electrode to the electrode for carrying the workpiece.

7. The chamber of claim 4 wherein the excitation region geometry is such that current at the high frequency has a tendency to flow to a greater extent between the first electrode to the surfaces of the excitation region at the reference potential than from the first electrode to the electrode for carrying the workpiece.

8. The chamber of claim 1 in combination with a processor including the first and second RF sources, the first RF source being connected to the first electrode, the second RE source being connected to the second electrode.

9. The combination of claim 8 further including a filter arrangement connected to the first and second RE sources and the first and second electrodes for: (1) enabling current from the first RE source to flow to the first electrode, (2) preventing the substantial flow of current from the first RE source to the second electrode and the second RE source, (3) enabling current from the second RF source to flow to the first and second electrodes, and (4) preventing the substantial flow of current from the second RE source to the first RE source.

10. A vacuum plasma chamber for processing a workpiece, the chamber including: a first electrode for electrical coupling with gas in the chamber and for connection to a first relatively high frequency RE source, a second electrode for carrying the workpiece and electrical coupling with gas in the chamber and for connection to a second relatively low frequency RE source, an exterior wall at a reference potential, and a plasma excitation region for confining the plasma, the plasma excitation region including louvers at the reference potential and the first and second electrodes, the louvers being spaced from the exterior wall, the plasma excitation region being arranged for enabling gas to be excited to the plasma to flow into the plasma confinement region and out of the confinement region between the louvers, the plasma excitation region including first and second surfaces at the reference potential, the first surface being located between the louvers and the electrode for carrying the workpiece, the second surface being located between the louvers and the first electrode.

11. The chamber of claim 10 wherein the plasma excitation region is bounded by said electrodes and louvers.

12. The chamber of claim 10 wherein the plasma excitation region is symmetrical with respect to the chamber exterior wall and a center point on the electrode for carrying the workpiece.

13. The chamber of claim 10 wherein the excitation region has a geometry such that different sheaths are developed between the plasma in the excitation region and between each of (a) the electrode for carrying the workpiece, (b) the first electrode and (c) the first and second surfaces at the reference potential.

14. The chamber of claim 13 wherein the excitation region geometry is such that current at the low frequency has a tendency to flow to a greater extent between the electrode for carrying the workpiece and the first electrode than from the electrode for carrying the workpiece to the surfaces of the excitation region at the reference potential.

15. The chamber of claim 14 wherein the excitation region geometry is such that current at the high frequency has a tendency to flow to a greater extent between the first electrode to the surfaces of the excitation region at the reference potential than from the first electrode to the electrode for carrying the workpiece.

16. The chamber of claim 13 wherein the excitation region geometry is such that current at the high frequency has a tendency to flow to a greater extent between the first electrode to the surfaces of the excitation region at the reference potential than from the first electrode to the electrode for carrying the workpiece.

17. The chamber of claim 10 in combination with a processor including the first and second RF sources, the first RF source being connected to the first electrode, the second RF source being connected to the second electrode.

18. The combination of claim 17 further including a filter arrangement connected to the first and second RF sources and the first and second electrodes for: (1) enabling current from the first RF source to flow to the first electrode, (2) preventing the substantial flow of current from the first RE source to the second electrode and the second RF source, (3) enabling current from the second RE source to flow to the first and second electrodes, and (4) preventing the substantial flow of current from the second RF source to the first RF source.

19. The chamber of claim 1 wherein the louvers have high electrical conductivity and are at the reference potential.

20. The chamber of claim 1 wherein the louvers have low electrical conductivity and float electrically and are arranged to mechanically confine the plasma.

21. The chamber of claim 20 wherein the spacing between adjacent pairs of the louvers is such as to provide the mechanical confinement.

22. The chamber of claim 21 wherein the spacing is adjustable.

23. The chamber of claim 10 wherein the louvers have high electrical conductivity and are at the reference potential.

24. The chamber of claim 10 wherein the louvers have low electrical conductivity and float electrically and are arranged to mechanically confine the plasma.

25. The chamber of claim 24 wherein the spacing between adjacent pairs of the louvers is such as to provide the mechanical confinement.

26. The chamber of claim 25 wherein the spacing is adjustable.

27. The chamber of claim 1 wherein the sum of the areas of the first and second surfaces is about two times the sum of the areas of the first and second electrodes.

28. The chamber of claim 10 wherein the sum of the areas of the first and second surfaces is about two times the sum of the areas of the first and second electrodes.

* * * * *